US010574242B2

United States Patent
Friend

(10) Patent No.: US 10,574,242 B2
(45) Date of Patent: Feb. 25, 2020

(54) PHASE LOCKED LOOP SAMPLER AND RESTORER

(71) Applicant: SYNAPTICS INCORPORATED, San Jose, CA (US)

(72) Inventor: Brian W. Friend, Carlsbad, CA (US)

(73) Assignee: SYNAPTICS INCORPORATED, San Jose, CA (US)

( * ) Notice: Subject to any disclaimer, the term of this patent is extended or adjusted under 35 U.S.C. 154(b) by 0 days.

(21) Appl. No.: 16/159,535

(22) Filed: Oct. 12, 2018

(65) Prior Publication Data

US 2019/0115927 A1 Apr. 18, 2019

Related U.S. Application Data

(60) Provisional application No. 62/571,736, filed on Oct. 12, 2017.

(51) Int. Cl.
| | |
|---|---|
| *H03L 7/091* | (2006.01) |
| *H03L 7/093* | (2006.01) |
| *H03L 7/099* | (2006.01) |
| *H03L 7/08* | (2006.01) |
| *H03L 7/107* | (2006.01) |

(52) U.S. Cl.
CPC ............ *H03L 7/091* (2013.01); *H03L 7/0807* (2013.01); *H03L 7/093* (2013.01); *H03L 7/099* (2013.01); *H03L 7/1072* (2013.01)

(58) Field of Classification Search
CPC combination set(s) only.
See application file for complete search history.

(56) References Cited

U.S. PATENT DOCUMENTS

| | | | |
|---|---|---|---|
| 5,719,508 A | 2/1998 | Daly | |
| 6,552,618 B2 * | 4/2003 | Nelson | H03L 7/087 331/1 A |
| 6,816,019 B2 * | 11/2004 | Delbo' | H03L 7/0891 327/156 |
| 6,959,064 B2 | 10/2005 | Spijker et al. | |
| 7,042,253 B2 * | 5/2006 | Su | H03L 7/099 327/11 |

(Continued)

FOREIGN PATENT DOCUMENTS

| | | |
|---|---|---|
| JP | 11-214991 | 8/1999 |
| KR | 10-0800143 | 2/2008 |

*Primary Examiner* — An T Luu
(74) *Attorney, Agent, or Firm* — Haynes and Boone, LLP

(57) ABSTRACT

Systems, methods, and apparatus for a circuit for synchronization of a reference signal and an output signal of a phased-lock loop (PLL) are disclosed. The method comprises continuously generating, by a clock detect circuit connected to the PLL, a clock detect signal indicating whether the reference signal of the PLL is present or lost. The method further comprises continuously sampling and storing, by a loop sampler circuit connected to the PLL, a voltage from a loop filter of the PLL, when the reference signal is present. In addition, the method comprises configuring a charge pump of the PLL into a high impedance state, thereby disabling the charge pump, when the clock detect signal indicates that the reference signal is lost. Further, the method comprises supplying the voltage to the PLL to maintain a frequency of the output signal of the PLL, when the reference signal is lost.

20 Claims, 8 Drawing Sheets

(56) References Cited

U.S. PATENT DOCUMENTS

| | | | |
|---|---|---|---|
| 7,047,146 B2 * | 5/2006 | Chuang | H03L 7/099 702/106 |
| 7,423,492 B2 | 9/2008 | Seefeldt | |
| 8,018,289 B1 | 9/2011 | Hu et al. | |
| 8,644,783 B2 | 2/2014 | Brauner | |
| 9,065,454 B2 * | 6/2015 | Lin | H03L 7/087 |
| 2007/0153953 A1 | 7/2007 | Garzarolli et al. | |
| 2013/0257495 A1 | 10/2013 | Teng | |

\* cited by examiner

PHASE LOCKED LOOP SAMPLER AND RESTORER

CROSS-REFERENCE TO RELATED APPLICATIONS

The present application claims the benefit of and priority to U.S. Provisional Patent Application No. 62/571,736, filed Oct. 12, 2017, which is hereby incorporated by reference in its entirety.

TECHNICAL FIELD

The present disclosure, in accordance with one or more embodiments, relates generally to phase locked loops (PLLs) and, more particularly for example, to systems and methods for generating stable clock signals.

BACKGROUND

Phase locked loops (PLLs) are used in a wide variety of electronic devices. In operation, a PLL generates an output clock signal that is locked in phase (i.e. synchronous) with a reference clock. If the PLL loses the reference clock, the PLL's output clock signal, which tracks the reference clock, may be reduced to zero (0) Hertz (Hz), or another low frequency. For many applications, it is desirable for the PLL to produce a stable output clock signal, even during a loss of the reference clock signal. Thus, there is a continued need to improve the stability of a PLL output clock signal during an unexpected loss of a reference clock signal.

SUMMARY

The present disclosure provides methods and systems to improve the stability of a PLL output clock signal during interruptions in, or loss of, the reference clock signal. In one or more embodiments, a method comprises continuously generating, by a clock detect circuit connected to a PLL, a clock detect signal indicating whether the reference clock signal input to the PLL is present or lost. The method further comprises continuously sampling and storing, by a loop sampler circuit connected to the PLL, a control voltage from a loop filter of the PLL, while the reference clock signal is present. When the reference clock signal is lost, the method comprises supplying the stored control voltage to the PLL to stabilize the output signal of the PLL. In one or more embodiments, the PLL includes a charge pump and the method comprises disabling the charge pump, such as by configuring the charge pump into a high impedance state, when the clock detect signal indicates that the reference signal is lost.

In one or more embodiments, the voltage is sampled from a capacitor of the loop filter and stored onto a first capacitor of the loop sampler circuit, when the reference signal is present; and the voltage is supplied to the loop filter, when the clock detect signal indicates that the reference signal is lost.

In one or more embodiments, the voltage is sampled from an output of the loop filter and stored onto a second capacitor of the loop sampler circuit, when the reference signal is present; and the voltage is supplied to an input of a voltage-controlled oscillator (VCO) of the PLL, when the reference signal is lost. In one or more embodiments, a second voltage is sampled from a capacitor of the loop filter and stored onto a first capacitor of the loop sampler circuit, when the reference signal is present; and the second voltage is supplied to the loop filter, when the clock detect signal indicates the reference signal is lost.

In one or more embodiments, the method further comprises receiving, by a pulse generator circuit of the loop sampler circuit, the reference signal, and generating pulses indicating a sampling period for the sampling of the voltage. In at least one embodiment, the pulse generator circuit samples falling edges of the reference signal, and a phase-frequency detector of the PLL aligns phases of rising edges of the reference signal and a feedback signal of the PLL. The pulses successively open and close a switch of the loop sampler circuit to sample the voltage, which is stored on a capacitor of the loop sampler circuit.

In at least one embodiment, the method further comprises continuously detecting, by the clock detect circuit, a reference signal; and after a predetermined amount of time without detecting the reference signal, generating, by the clock detect circuit, the clock detect signal indicating that the reference signal is lost. In one or more embodiments, the voltage is supplied to the PLL via a voltage buffer of the loop sampler circuit.

In one or more embodiments, a system comprises a phase locked loop (PLL) operable to synchronize a reference signal and an output signal, a clock detect circuit and a loop sampler circuit. The clock detect circuit is connected to the PLL and is operable to generate a clock detect signal indicating whether the reference signal of the PLL is present or lost. The loop sampler circuit is connected to the PLL and the clock detect circuit and operable to sample and store a voltage from a loop filter of the PLL when the reference signal is present. In one or more embodiments, when the reference signal is lost, a charge pump of the PLL is disabled and the stored voltage is supplied to the PLL to maintain a stable PLL output signal.

The scope of the present disclosure is defined by the claims, which are incorporated into this section by reference. A more complete understanding of the present disclosure will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Aspects of the disclosure and their advantages can be better understood with reference to the following drawings and the detailed description that follows. It should be appreciated that like reference numerals are used to identify like elements illustrated in one or more of the figures, where showings therein are for purposes of illustrating embodiments of the present disclosure and not for purposes of limiting the same. The components in the drawings are not necessarily to scale, emphasis instead being placed upon clearly illustrating the principles of the present disclosure.

DETAILED DESCRIPTION

Systems and methods are disclosed herein to improve the stability of a phase locked loop (PLL) circuit during an unexpected loss of a reference clock input. In various embodiments, systems and methods of the present disclosure allow a PLL to respond gracefully to unexpected loss of reference clock occurrences to maintain a stable output.

PLLs are used in a variety of systems (e.g., a very-large-scale-integration (VLSI) chip) to generate one or more high frequency master clock signals. In various embodiments, the PLL receives a reference clock signal and generates one or more output signals, such as a higher frequency output clock signal. The reference clock signal input to the PLL may be stopped and re-started by an external clock source without warning, which may adversely affect operation of one or more system components. When the reference clock signal input to the PLL is lost, the PLL's output clock signal, which tracks the reference clock signal, will also be lost as the output reduces towards zero (0) Hertz (Hz), or another low frequency. The systems and methods disclosed herein allow a PLL to respond gracefully during a loss of the reference clock signal and maintain a stable output signal.

In accordance various embodiments of the disclosure, a PLL and clock restorer circuit includes a PLL, a clock detect circuit and a loop sampler circuit. During operation of the PLL, the loop sampler circuit samples and stores a control voltage of the PLL. When the reference clock is lost, the circuits of the present disclosure utilize the stored control voltage to maintain a relatively stable output frequency until the reference clock signal returns.

Figure 1:
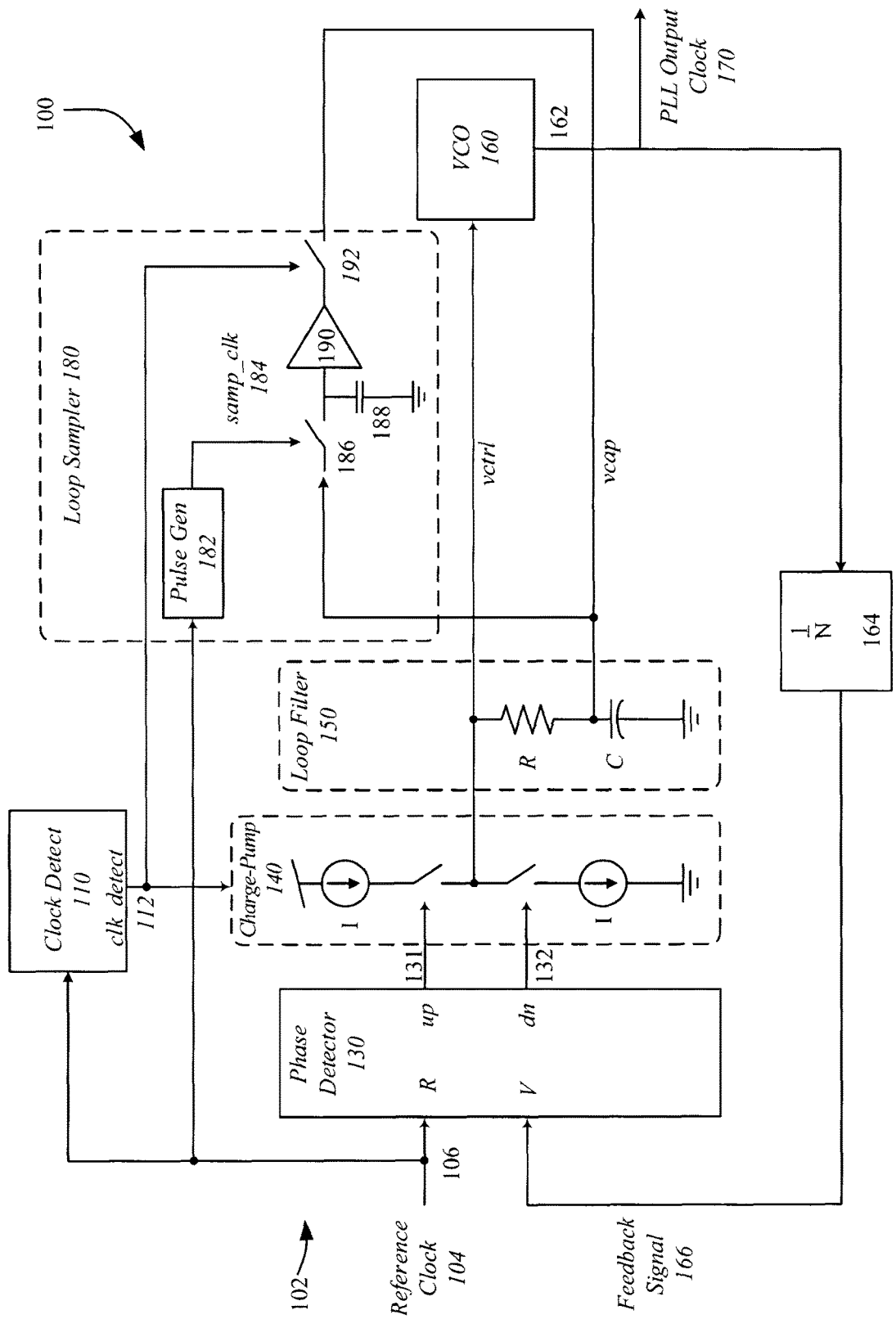
FIG. 1 is a diagram illustrating a first exemplary PLL and clock restorer circuit, in accordance with one or more embodiments of the present disclosure.

FIG. 1 is a diagram illustrating a first exemplary PLL and clock restorer circuit 100, in accordance with one or more embodiments of the present disclosure. In the illustrated embodiment, the PLL and clock restorer circuit 100 includes a PLL 102, a clock detect circuit 110 and a loop sampler circuit 180. The PLL 102 includes a phase detector 130, charge pump 140, a loop filter 150 (e.g., a loop filter circuit), a voltage-controlled oscillator (VCO) 160 and a frequency divider 164. The phase detector 130 is coupled to a reference clock 104, which provides a reference signal 106 input to the phase detector 130. The phase detector 130 is also arranged to receive a feedback signal 166. In one or more embodiments, the VCO 160 generates an output signal 162, which is input to the frequency divider 164 to generate the feedback signal 166. In one embodiment, the frequency divider 164 is a divide by N counter that divides the frequency of output signal 162 by a number N to produce the feedback signal 166. For example, if the output signal 162 has a frequency of 160 megahertz (MHz) and the divide by N counter has N equal to 16, then the feedback signal 166 will have a frequency of 10 MHz.

In one embodiment, the phase detector 130 is a phase-frequency detector operable to compare the phases and frequencies of the reference signal 106 and the feedback signal 166, and output a control signal to adjust the feedback signal 166 accordingly to have a phase and frequency synchronized with the phase and frequency of the reference signal 106. For example, in various embodiments the phase detector 130 aligns the phases of the rising edges of the reference signal 106 and the feedback signal 166, by generating a control signal to adjust the feedback signal 166.

The control signal generated by the phase detector 130 is output to the charge pump 140. In various embodiments, the phase detector 130 generates an "up" voltage signal 131 that is input to the charge pump 140 and passed through the loop filter 150 to increase the voltage and frequency of the VCO 160, and generates a "down" voltage signal 132 that is input to the charge pump 140 and passed through the loop filter 150 to decrease the voltage and frequency of the VCO 160. The VCO 160 generates the output signal 162, which may be provided as a PLL output clock signal 170 to one or more electronic components (not shown).

The PLL 102 operates as a feedback loop to lock the phase and frequency of the output signal 162 to the phase and frequency of the reference signal 106. When the reference signal 106 is lost (e.g., if the reference clock 104 is not operational), the PLL 102 output signal 162 will adjust towards the value remaining at the reference input to the phase detector 130, which may have a frequency of 0 Hz (or another low frequency value), until the reference signal 106 returns. In various embodiments disclosed herein, the clock detect circuit 110 and the loop sampler circuit 180 operate to generate a consistent output signal 162 from the PLL 102, even during a period when the reference clock signal 106 is lost.

The clock detect circuit 110 is operable to detect whether the reference signal 106 is present or lost and output a corresponding clock detect signal 112. In the illustrated embodiment, the clock detect circuit 110 is coupled to reference clock 104 to receive the reference signal 106 input to the phase detector 130. The clock detect circuit 110 detects the presence or absence of the reference signal 106 and outputs a corresponding clock detect signal (clk_detect) 112. In one embodiment, the clock detect signal 112 is a flag set to 1 if the reference clock signal 106 is detected by the clock detect circuit 110, and set to 0 if the reference clock signal 106 is determined to be lost by the clock detect circuit 110. The output of the clock detect circuit 110 is coupled to the charge pump 140 of the PLL 102 and a buffer switch 192 of the loop sampler circuit 180, which are operable in response to the clock detect signal 112.

The loop sampler circuit 180 is operable to sample a control voltage from the PLL 102 and provide the sampled voltage to the PLL 102 to drive the VCO 160 when the reference signal 106 is lost. In the illustrated embodiment, the loop sampler circuit 180 includes a pulse generator 182, a control voltage switch 186 (also referred to herein as a sampling switch), a control voltage capacitor 188 connected to ground, a control voltage buffer 190 (e.g., a buffer amplifier) and the buffer switch 192. The buffer switch 192 is coupled between the control voltage buffer 190 and a capacitor (C) of the loop filter 150, and is controlled by the clock detect signal 112. In various embodiments, the buffer switch is controlled based on a detected status of the reference signal such that buffer switch is open when the clock detect signal is set to 1 (reference signal 106 determined to be present) and closed when the clock detect signal is set to 0 (reference signal 106 determined to be lost).

The pulse generator 182 is coupled to receive the reference signal 106 input to the PLL 102. In operation, the pulse generator 182 uses the reference signal 106 as an input to generate a sampling pulse 184 (samp_clk) to control the control voltage switch 186. The control voltage switch 186 is coupled between the loop filter capacitor (C) and the control voltage capacitor 188 of the loop sampler circuit 180, and is successively opened and closed by the sampling pulse 184. When the control voltage switch 186 is closed, the control voltage (vcap) from the capacitor (C) within the loop filter 150 is sampled and stored on the control voltage capacitor 188.

In various embodiments, the pulse generator 182 generates a narrow sampling pulse from the falling edges of the reference signal 106. As previously discussed, the phase detector 130 of the illustrated embodiment is operable to align the phases of the rising edges of the reference signal 106 and the feedback signal 166. Thus, in these embodiments, the control voltage (vcap) is sampled on the falling edge of the reference signal 106 to limit the disturbance on the operation of the PLL 102.

During operation of the PLL and clock restorer circuit 100, the reference signal 106 from the reference clock 104 is input to the clock detect circuit 110 and the pulse generator 182. When the reference signal 106 is present, the clock detect circuit 110 sets the clock detect signal 112 to indicate that the reference signal 106 is present (e.g., clk_detect=1). The clock detect signal 112 is output to the charge pump 140 and the buffer switch 192. The charge pump 140 receives the clock detect signal 112 and remains operational while the clock detect signal 112 indicates the reference signal 106 is present. The buffer switch 192 is controlled by the clock detect signal 112 and remains open while the clock detect signal 112 indicates the reference signal 106 is present. Thus, while the reference signal 106 is present, the PLL 102 operates to generate the PLL output clock signal 170 having a phase and frequency synchronized with the phase and frequency of the reference signal 106, and the loop sampler circuit 180 samples the control voltage (vcap) from a capacitor (C) the loop filter 150 on the falling edge of the reference signal 106.

If the reference signal 106 is lost (e.g., if the reference clock 104 is not operational), the clock detect circuit 110 changes the clock detect signal 112 to indicate that the reference signal 106 is lost (e.g., set clk_detect=0). In various embodiments, the clock detect circuit 110 is operable to determine that the reference signal 106 is lost if the reference signal 106 is not detected at the clock detect circuit 110 for a predetermined interval of time. In these embodiments, this "delay period" may be a short period set to minimize false "lost signal" triggers (e.g., due to jitter in an active signal) and in accordance with other system requirements. In one embodiment, when the reference signal 106 is detected by the clock detect circuit 110, the clock detect circuit 110 is operable to change the clock detect signal to "1" without delay.

When the clock detect circuit 110 determines that the reference signal 106 has been lost, the charge pump 140 is disabled by the clk_detect signal 112. For example, in one or more embodiments, the charge pump 140 is operational when the clk_detect signal 112 is set to 1, and enters a high impedance (Hi-Z) state when it receives a clk_detect signal 112 set to 0, thereby disabling the charge pump 140.

The clock detect signal 112 is also provided to the loop sampler circuit 180 to control the buffer switch 192. When the clk_detect signal 112 is set to 1, indicating that the reference signal 106 is present, the buffer switch 192 is maintained in an open position. When clk_detect signal 112 is set to 0, indicating that the reference signal 106 has been lost, the buffer switch 192 closes, coupling the control voltage capacitor 188 and the control voltage buffer 190 to the capacitor (C) of the loop filter 150. Because the reference signal 106 has been lost, the pulse generator 182 no longer receives an input signal and will no longer generate sampling pulses 184 to drive the control voltage switch 186. As a result, the control voltage switch 186 remains open and sampling of the control voltage (vcap) stops. The control voltage (vcap) stored on the control voltage capacitor 188 is coupled (through the control voltage buffer 190 and buffer switch 192) to the loop filter 150 to charge capacitor (C) to the last sampled control voltage. As a result, the capacitor (C) is operable to drive the VCO 160, thereby allowing the output signal 162 to remain relatively stable even though the reference signal 106 has been lost. When the reference signal 106 returns, the pulse generator 182 will produce sample clock signal 284 and sampling will continue through switches 286 and 294.

In various embodiments, the PLL and clock restorer circuit 100 is configurable between two or more operation modes. For example, the PLL and clock restorer circuit 100 may operate in a standard PLL mode by disabling the clock detect circuit 110 (e.g., setting the clock detect signal 112 to output a "1" even if the reference clock signal is lost) and, optionally, disabling the sampling by the control voltage switch 186 and control voltage capacitor 188 by disabling the pulse generator 182.

Figure 2:
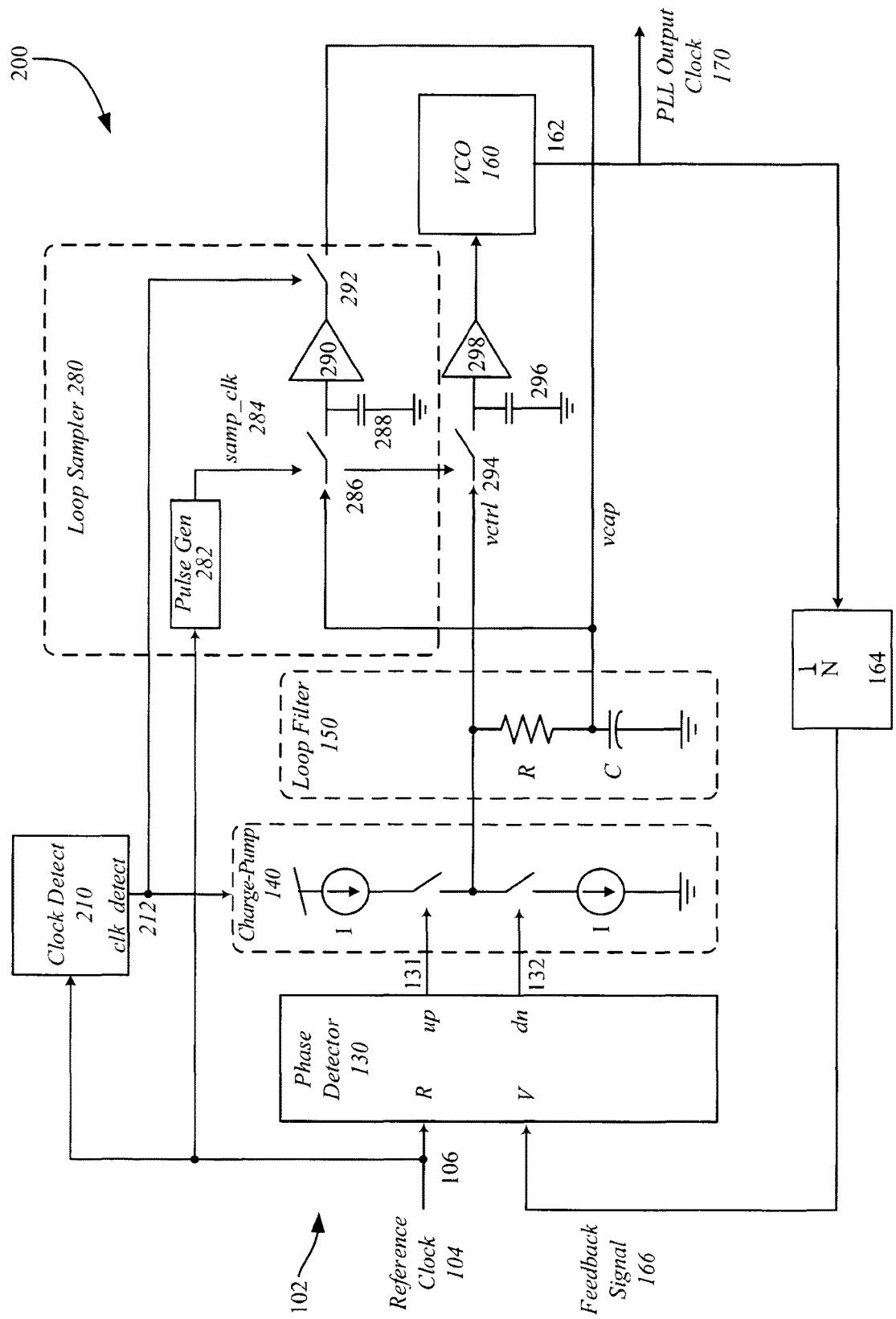
FIG. 2 is a diagram illustrating a second exemplary PLL and clock restorer circuit, in accordance with one or more embodiments of the present disclosure.

FIG. 2 is a diagram illustrating a second exemplary PLL and clock restorer circuit 200, in accordance with one or more embodiments of the present disclosure. As illustrated, the PLL and clock restorer circuit 200 may include a PLL circuit, such as PLL 102 described with reference to FIG. 1, which includes the phase detector 130 coupled to the reference clock 104 to receive the reference signal 106, the charge pump 140, the loop filter 150 and the VCO 160. A clock detect circuit 210 is coupled to the reference clock 104 to receive the reference signal 106 and generate a clk_detect signal 212 indicating whether the reference signal 106 is "present" or has been determined to be "lost".

A loop sampler circuit 280 includes a pulse generator circuit 282, a first control voltage switch 286, a first control voltage capacitor 288, a first voltage buffer 290, a buffer switch 292, a second control voltage switch 294, a second control voltage capacitor 296 and a second voltage buffer 298. In operation of the PLL 102, the clock detect circuit 210 receives the reference signal 106 and generates the clock detect signal 212 (clk_detect) indicating that the reference signal 106 is present. The clock detect signal 212 is sent to charge pump 140, which is maintained in a normal operation mode, and to the buffer switch 292 which remains open.

The pulse generator circuit 282 receives the reference signal 106 from the reference clock 104, and generates a narrow sampling pulse from the falling edges of the reference signal 106 to produce a sample clock signal 284 (samp_clk). In one or more embodiments, the phase detector 130 aligns the phases of the rising edges of the reference signal 106 and the feedback signal 166. By sampling on the falling edges of the reference signal 106, the pulse generator circuit 282 limits the disturbance of the operation of the PLL 102. The sample clock signal 284 controls the successive opening and closing of the first control voltage switch 286 and the second control voltage switch 294 during operation of the PLL 102. During the switching of the first control voltage switch 286, the control voltage (vcap) from the capacitor (C) of the loop filter 150 is sampled and stored on the first control voltage capacitor 288. During switching of the second control voltage switch 294, the control voltage (vctrl) output from the loop filter 150 for input to the VCO 160 is sampled and stored on the second control voltage capacitor 296.

When the reference signal 106 is lost, the clock detect circuit 210 first detects that no signal is being received, and then monitors the input signal over for a predetermined interval of time to confirm the signal has been lost (e.g., to confirm the detected signal loss wasn't the result of jitter). After the predetermined interval of time, if the reference signal 106 is still lost, the clock detect circuit 210 sets the clock detect signal 212 to 0 to indicate the reference signal has been lost. The clock detect signal 212 is sent to the charge pump 140 to configure the charge pump 140 into a high impedance (Hi-Z) state, thereby disabling the charge pump 140. The clock detect signal 212 is also sent to the buffer switch 292 to close the buffer switch 292 until the clock detect signal is changed to indicated that the reference signal 106 is present. In one embodiment, when the reference signal 106 is detected by the clock detect circuit 210, the clock detect circuit 210 is operable to change the clock detect signal to "1" without delay.

When the reference signal 106 is lost, the pulse generator circuit 282 is no longer receiving an input signal, and thus no longer produces the sample clock signal 284. As a result, the first control voltage switch 286 and the second control voltage switch 294 both remain open. The control voltage (vctrl) stored on second control voltage capacitor 296 is input to the VCO 160 through the second voltage buffer 298, thereby allowing the output signal 162 to remain relatively stable while the reference signal 106 is lost. Further, the closed buffer switch 292 couples the control voltage (vcap) stored on the first control voltage capacitor 288 to capacitor (C) of the loop filter 150 to maintain charge at a previous control voltage (vcap) level, allowing the PLL 102 to maintain operation when the reference signal 106 is present again.

In various embodiments, the PLL and clock restorer circuit 200 is configurable between two or more operation modes. For example, the PLL and clock restorer circuit 200 may operate in a standard PLL mode by disabling the clock detect circuit 210 (e.g., setting the clock detect signal 212 to output a "1" even if the reference clock signal is lost) and, optionally, disabling the sampling by the switches 186 and 294 and capacitors 288 and 296, respectively, by disabling the pulse generator circuit 282. The PLL and clock restorer circuit 200 may also be configured to operate in accordance with the embodiment of FIG. 1 by disabling the sampling of control voltage (vctrl) and closing the second control voltage switch 294 during operation.

Figure 3:
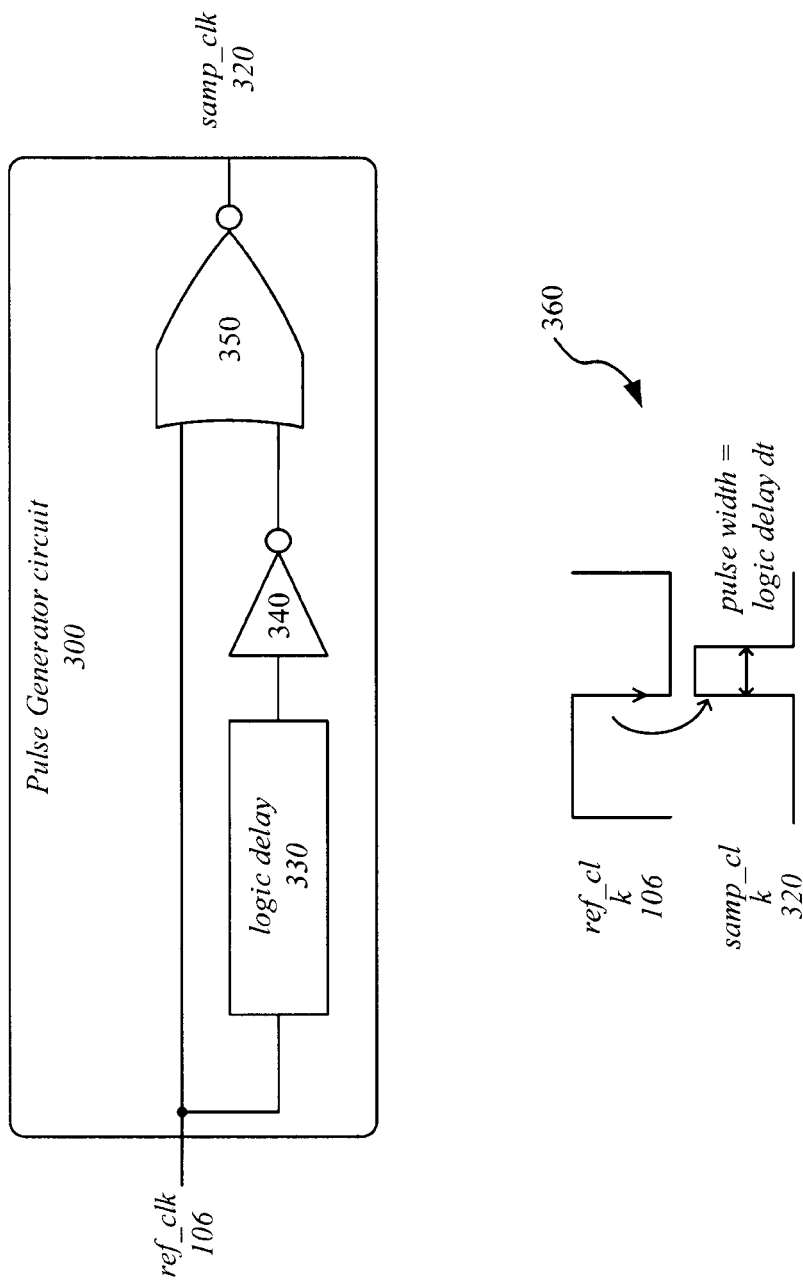
FIG. 3 is a diagram illustrating an exemplary pulse generator circuit, in accordance with one or more embodiments of the present disclosure.

FIG. 3 is a diagram illustrating an exemplary pulse generator circuit 300, in accordance with one or more embodiments of the present disclosure. The pulse generator circuit 300 may be implemented as the pulse generator 182 in the embodiment of FIG. 1, the pulse generator circuit 282 in the embodiment of FIG. 2, or in other embodiments. As illustrated, the pulse generator circuit 300 includes a logic delay 330, an inverter 340, and a NOR gate 350. During operation, the reference signal input 106 (ref_clk) from the reference clock 104 (not shown in FIG. 3) is input to the pulse generator circuit 300. As shown in the clock diagram 360, the pulse generator circuit 300 is operable to generate a narrow sampling pulse from the falling edges of the reference signal 106 to produce a sample clock signal 320 (samp_clk) that allows for sampling of the PLL control voltage(s) without disturbing the operation of the PLL in many embodiments.

Figure 4:
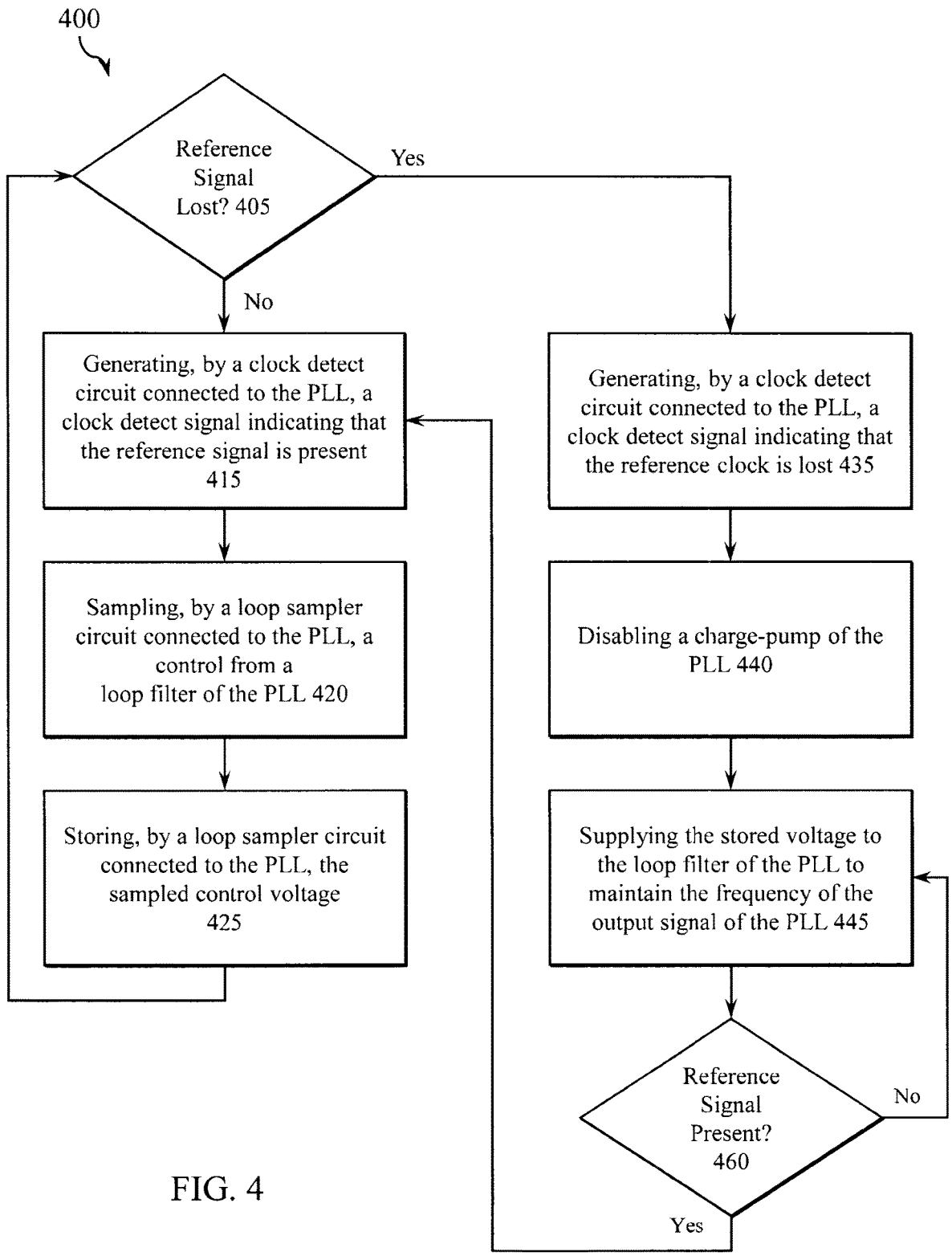
FIG. 4 is a flow chart illustrating an exemplary operation of the PLL and clock restorer circuit of FIG. 1, in accordance with one or more embodiments of the present disclosure.

FIG. 4 is a flow chart illustrating an exemplary operation 400 of the PLL and clock restorer circuit of FIG. 1, in accordance with one or more embodiments of the present disclosure. During operation of the PLL to generate an output clock signal, a clock detect circuit coupled to the reference signal determines whether the reference signal is lost in step 405. If the clock detect circuit determines that the reference signal is present, the clock detect signal generates a clock detect signal indicating that the reference signal is present in step 415. In step 420, the loop sampler circuit continuously samples a control voltage from the PLL and the sampled voltage is stored in step 425. Steps 415, 420 and 425 are continuously performed until the reference signal is determined lost in step 405.

If the clock detect circuit determines that the reference signal is lost (step 405), then the clock detect circuit generates a clock detect signal indicating that the reference clock is lost in step 435. A charge pump of the PLL is disabled in step 440, such as by configuring the charge pump to enter a high impedance state. The stored voltage is supplied to the loop filter of the PLL to maintain the frequency of the output signal of the PLL in step 445. In step 460, the clock detect circuit determines whether the reference signal is present. The stored voltage is supplied to the loop filter while the reference signal is lost. When the reference signal is detected by the clock detect circuit, the clock detect signal is changed to indicate the reference clock is present in step 415.

Figure 5:
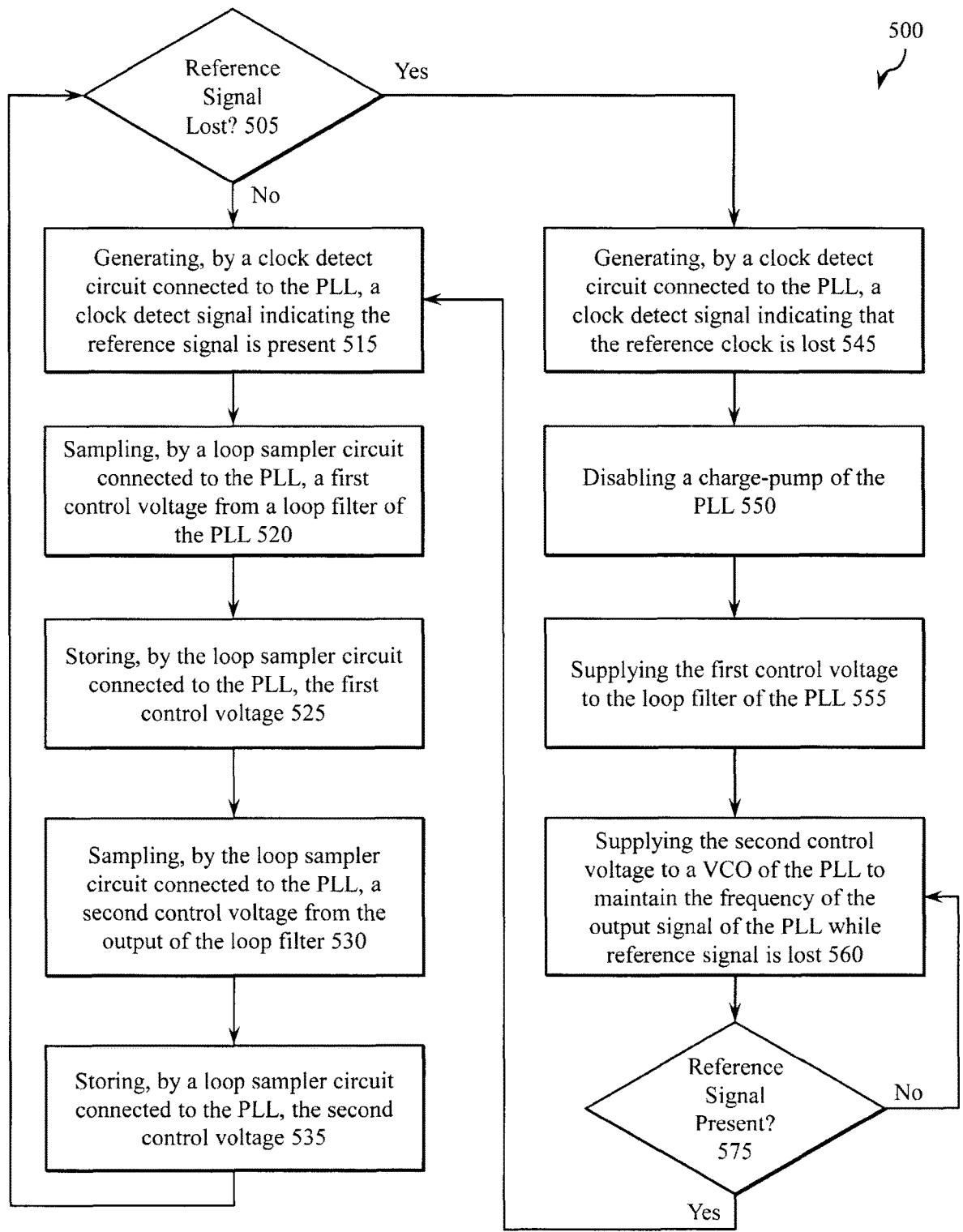
FIG. 5 is a flow chart illustrating an exemplary operation of the PLL and clock restorer circuit of FIG. 2, in accordance with one or more embodiments of the present disclosure.

FIG. 5 is a flow chart illustrating an exemplary operation 500 of the PLL and clock restorer circuit of FIG. 2, in accordance with one or more embodiments of the present disclosure. During operation of the PLL to generate a stable output clock signal, a clock detect circuit coupled to the reference signal determines whether the reference signal is lost in step 505. If the clock detect circuit determines that the reference signal is not lost, the clock detect circuit generates a clock detect signal indicating that the reference clock is present in step 515. In step 520, a loop sampler circuit connected to the PLL continuously samples a first control voltage from a loop filter of the PLL. The loop sampler circuit then stores the first control voltage in step 525. In step 530, the loop sampler circuit continuously samples a second control voltage from the output of the loop filter. The loop sampler circuit then stores the second voltage in step 535, and the method repeats to step 505. Steps 515, 520, 525, 530 and 535 are continuously performed until the reference signal is determined lost in step 505.

If the clock detect circuit determines that the reference signal is lost (step 505), then the clock detect circuit generates a clock detect signal indicating that the reference signal is lost in step 545. In step 550, a charge pump of the PLL is maintained in a disabled state, such as by entering a high impedance state. The first control voltage is supplied to the loop filter of the PLL in step 555. The second control voltage is supplied to a voltage-controlled oscillator of the PLL to maintain the frequency of the output signal of the PLL in step 560. When the reference signal is detected again by the clock detect circuit (step 575), the clock detect signal is changed to indicate the reference clock is present in step 515.

Figure 6:
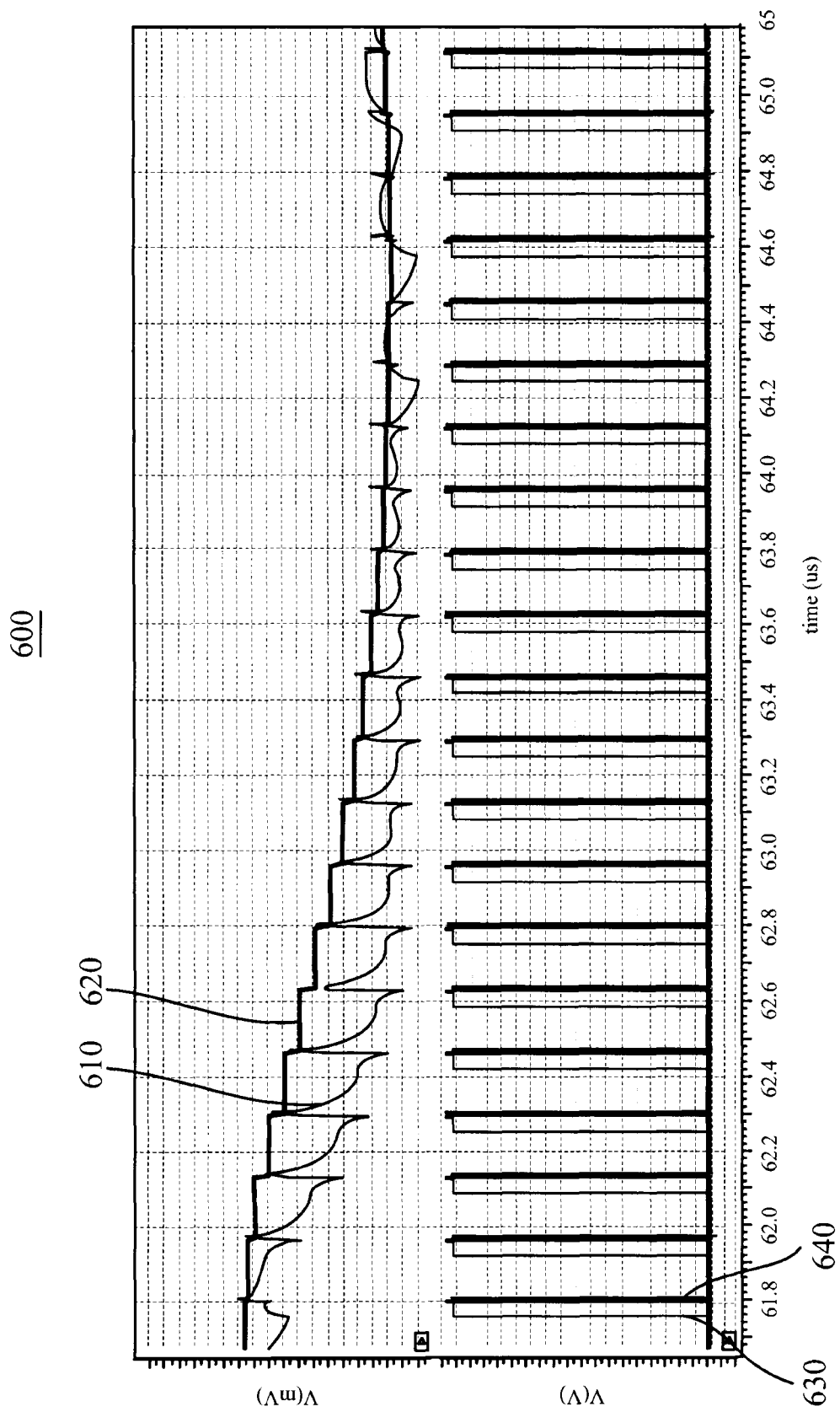
FIG. 6 is a graph illustrating exemplary measured control voltages during operation of various PLL and clock restorer circuits, in accordance with one or more embodiments of the present disclosure.

FIG. 6 is a graph 600 illustrating exemplary measured control voltages during operation of various PLL and clock restorer circuits, in accordance with one or more embodiments of the present disclosure. A measured control voltage (vctrl) 610, a sampled control voltage 620 stored by the loop sampler circuit, exemplary reference clock pulses 630, and exemplary sampled clock pulses 640 generated by a pulse generator circuit of the loop sampler circuit are illustrated. As illustrated, the reference clock pulses 630 are sampled on their falling edges to produce the sampled clock pulses 640. This figure also shows that the loop sampler circuit is sampling and storing the control voltage 610 on each pulse until the next sampled clock pulse to produce the sampled control voltage 620.

Figure 7:
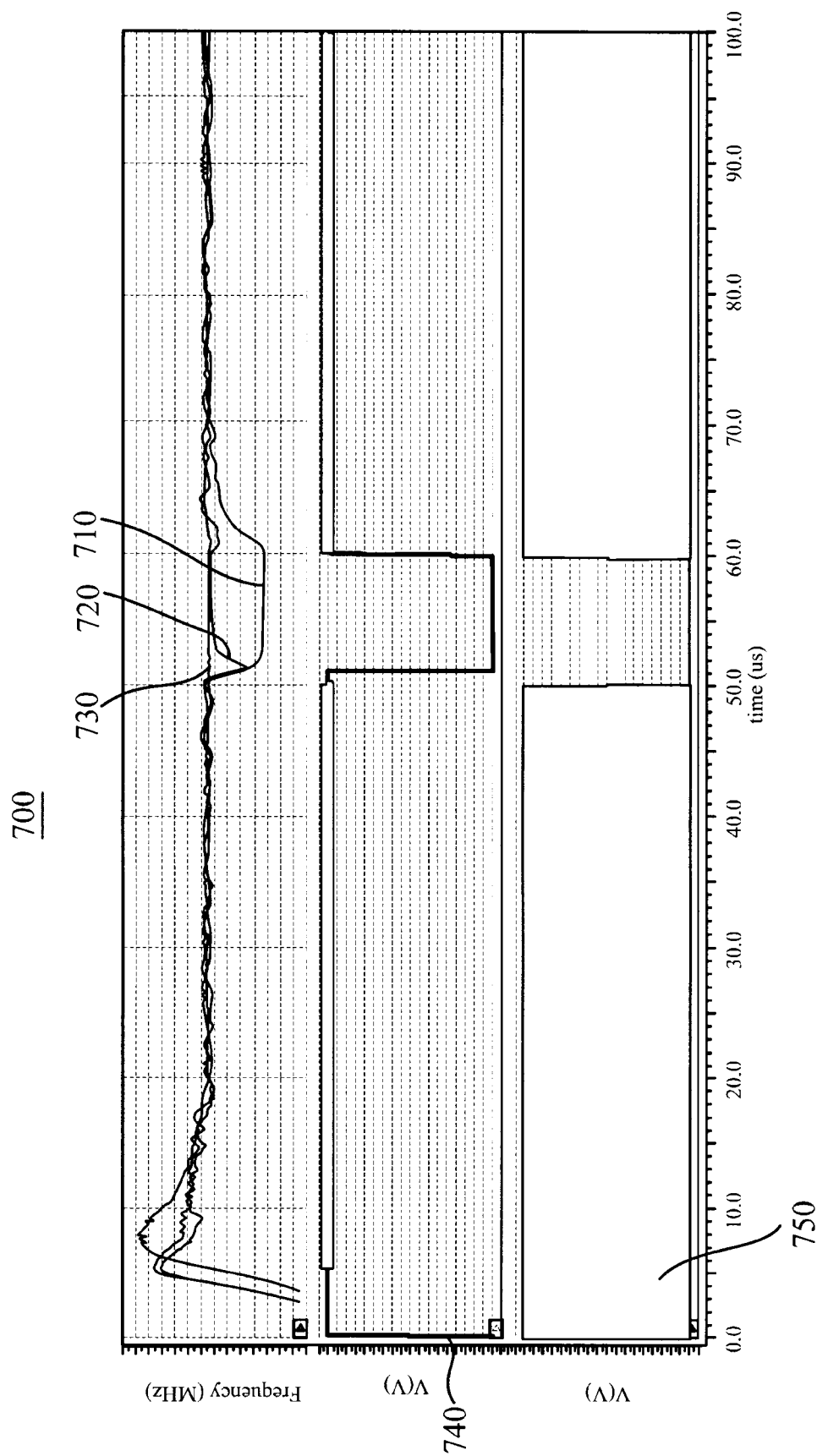
FIG. 7 is a graph illustrating exemplary responses to a loss in reference clock signal by various PLL and clock restorer circuits, in accordance with one or more embodiments of the present disclosure.

FIG. 7 is a graph 700 illustrating exemplary responses to a loss in reference signal by various PLL and clock restorer circuits, in accordance with one or more embodiments of the present disclosure. As illustrated, the figure shows that during the loss of a reference clock signal 740 produced by reference clock 750, the frequency of the output signal for a PLL 710 drops and maintains a low frequencies until the reference clock signal 740 is recovered. The output voltage of a PLL and clock recovery circuit of FIG. 1 is represented by plot 720. When the reference clock signal 740 is lost, the output frequency drops until the clock detect circuit determines that the signal was lost. After the clock detect signal is set to indicate that the reference signal is lost, the output signal recovers to the previous frequency and remains relatively stable after the predetermined delay of time has lapsed. The output frequency of the PLL and clock recovery circuit of FIG. 2 is represented by plot 730. In this embodiment, the frequency remains relatively stable during the entire duration of the loss of the reference clock signal 740.

Figure 8:
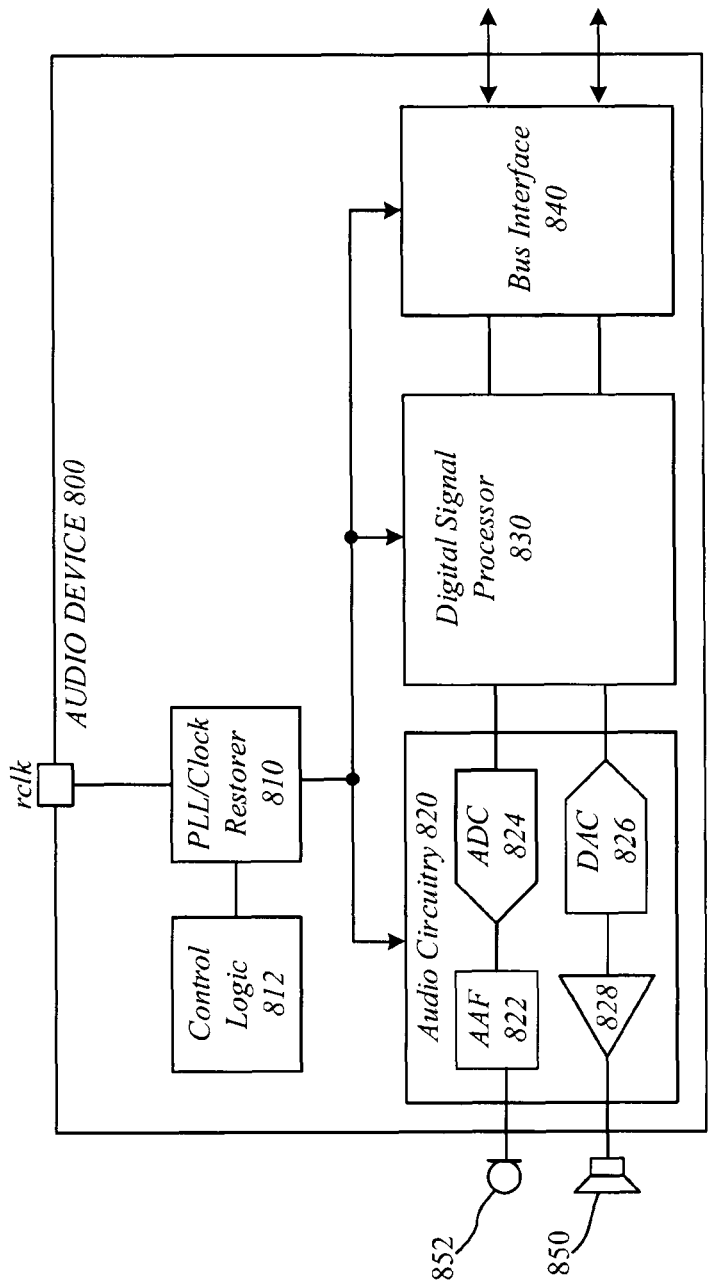
FIG. 8 is a diagram illustrating an exemplary implementation of PLL and clock restorer circuitry in an audio processing device in accordance with one or more embodiments of the present disclosure.

FIG. 8 is a diagram showing an exemplary system on chip (SOC) that may employ the disclosed PLL and clock restorer circuit, in accordance with at least one embodiment of the present disclosure. In this figure, the SOC is an audio device 800 for processing audio input and output signals that may be used in a variety of devices such as mobile phones, tablet computers, laptops, desktop computers, televisions, wearable devices or other devices that perform audio input or output processing. The audio device 800 includes a PLL/Clock Restorer 810, such as the PLL and clock restorer circuitry disclosed in FIG. 1 or FIG. 2. The PLL/Clock Restorer 810 receives a reference clock (rclk), which may be a master clock signal received from other components of the device, and outputs at least one output clock signal used for timing and synchronization of various components of audio device 800, such as audio circuitry 820, digital signal processor (DSP) 830 and bus interface 840. The audio circuitry 820 may include audio input circuitry, such as antialiasing filters 822 and analog-to-digital converter 824, for receiving and processing audio input signals from one or more sensors, such as microphone 852. The audio circuitry 820 may also include audio output circuitry, such as digital-to-audio converter 826, and driver amplifier 828 for receiving digital audio signals from the DSP 830 and driving one or more loudspeakers 850. The DSP 830 may be a programmable DSP operable to perform digital signal processing functions for the audio device 800. The bus interface 840 communicates with other system components, such as system computer processor of a system device. In many applications, such as a voice-over-IP application or an application that processes voice commands, audio input/output processing may be performed in real-time and may include communication with other devices through the bus interface 840. In such systems, the loss of a reference clock signal may impact the ability of the audio device 800 to perform necessary audio processing and communications, such as by causing the device to miss a voice command. As such, the implementation of the disclosed PLL/Clock Restorer 810 allows for a stable operation of the audio circuitry 820, DSP 830 and bus interface 840, for example, even during the loss of a reference signal.

In the illustrated embodiment, the audio device further includes control logic 812 for controlling and configuration of the PLL/Clock Restorer 810. In one embodiment, the PLL and clock restorer circuit 100 of FIG. 1 may be configured for operation in a plurality of modes. For example, the PLL and clock restorer circuit 100 may include a PLL mode and a clock restoration mode. In one embodiment, a PLL mode may be selected by setting the clock detect signal to 1 and/or disengaging the sampling circuit. In the embodiment of FIG. 2, it is contemplated that a PLL mode may be implemented by closing the second switch and disabling the sampling. The embodiment of the FIG. 1 may be implemented by closing the second switch of FIG. 2, but maintaining sampling on the first switch as described in FIG. 1. These and other configurations may be implemented in accordance with embodiments of the present disclosure.

Where applicable, various embodiments provided by the present disclosure may be implemented using hardware, software, or combinations of hardware and software. In addition, where applicable, the various hardware components and/or software components set forth herein may be combined into composite components comprising software, hardware, and/or both without departing from the scope of the present disclosure. Where applicable, the various hardware components and/or software components set forth herein may be separated into sub-components comprising software, hardware, or both without departing from the scope of the present disclosure. In addition, where applicable, it is contemplated that software components may be implemented as hardware components and vice versa.

Software, in accordance with the present disclosure, such as program code and/or data, may be stored on one or more computer readable mediums. It is also contemplated that software identified herein may be implemented using one or more general purpose or specific purpose computers and/or computer systems, networked and/or otherwise. Where applicable, the ordering of various steps described herein may be changed, combined into composite steps, and/or separated into sub-steps to provide features described herein.

The foregoing disclosure is not intended to limit the present disclosure to the precise forms or particular fields of use disclosed. As such, it is contemplated that various alternate embodiments and/or modifications to the present disclosure, whether explicitly described or implied herein, are possible in light of the disclosure. Having thus described embodiments of the present disclosure, persons of ordinary skill in the art will recognize that changes may be made in form and detail without departing from the scope of the present disclosure. Thus, the present disclosure is limited only by the claims.

What is claimed is:
1. A method comprising:
synchronizing an output signal of a phase locked loop (PLL) circuit with a reference signal;
detecting a status of the reference signal and generating a corresponding clock detect signal indicating whether the reference signal of the PLL is present or lost;
sampling and storing a control voltage from a loop filter circuit of the PLL while the reference signal is present; and supplying the stored control voltage to the PLL to stabilize the output signal when the clock detect signal indicates the reference signal is lost.

2. The method of claim 1, wherein the the loop filter circuit comprises a loop filter capacitor;
wherein sampling and storing the control voltage from the loop filter circuit of the PLL further comprises sampling the control voltage from the loop filter capacitor and storing the sampled control voltage on a first capacitor of a loop sampler circuit; and
wherein supplying the stored control voltage to the PLL further comprises coupling the loop filter capacitor to the first capacitor of the loop sampler circuit.

3. The method of claim 1, wherein the PLL circuit comprises a voltage-controlled oscillator (VCO) and the loop filter circuit is operable to supply the control voltage to an input of the VCO;
wherein sampling and storing the control voltage of the PLL further comprises sampling the control voltage from an output of the loop filter circuit and storing the sampled control voltage on a second capacitor of a loop sampler circuit; and
wherein supplying the control voltage to the PLL further comprises coupling the second capacitor of the loop sampler circuit to the input of the VCO.

4. The method of claim 3, wherein the loop filter circuit comprises a loop filter capacitor, and wherein sampling and storing the control voltage of the PLL further comprises sampling a loop filter capacitor voltage from the loop filter capacitor and storing the sampled loop filter capacitor voltage on a first capacitor of the loop sampler circuit; and
wherein supplying the control voltage to the PLL further comprises coupling the loop filter capacitor to the first capacitor of the loop sampler circuit.

5. The method of claim 4, wherein synchronizing the output signal of the PLL circuit with the reference signal further comprises aligning rising edges of the reference signal and the output signal, and wherein sampling and storing the control voltage of the PLL while the reference signal is present further comprises receiving the reference signal at a pulse generator circuit and generating a sampling pulse aligned with falling edges of the reference signal.

6. The method of claim 5, wherein the loop sampling circuit further comprises a sampling switch coupled to receive the sampling pulse, the method further comprising successively opening and closing the sampling switch to sample the control voltage from the PLL, wherein the control voltage is sampled when the sampling switch is closed.

7. The method of claim 1, wherein detecting a status of the reference signal and generating a corresponding clock detect signal further comprises:
receiving the reference signal as an input to a clock detect circuit, the clock detect circuit operable to output the clock detect signal indicating a presence of the reference signal; and
detecting an absence of the reference signal at the input to the clock detect circuit for a predetermined interval of time and outputting the corresponding clock detect signal indicating the reference signal is lost.

8. The method of claim 7, wherein supplying the stored control voltage to the PLL to stabilize the output signal when the clock detect signal indicates the reference signal is lost further comprises:
controlling a switch of a loop sampler circuit with the clock detect signal, wherein the switch is open when the corresponding clock detect signal is present, and wherein the switch is closed when the corresponding clock detect signal is lost.

9. The method of claim 8, wherein the control voltage is supplied to the PLL via a voltage buffer of the loop sampler circuit.

10. The method of claim 7, wherein the PLL circuit comprises a charge pump coupled to the clock detect circuit to receive the clock detect signal, the method further comprising disabling the charge pump when the clock detect signal indicates that the reference signal is lost.

11. A system comprising:
a phase locked loop (PLL) operable to synchronize a reference signal and an output signal;
a clock detect circuit coupled to receive the reference signal and operable to generate a clock detect signal indicating whether the reference signal of the PLL is present or lost; and
a loop sampler circuit connected to the PLL, wherein the loop sampler circuit is operable to sample and store a control voltage from a loop filter of the PLL when the reference signal is present; and
wherein when the reference signal is lost the stored control voltage is supplied to the PLL to stabilize the output signal of the PLL until the reference signal is present.

12. The system of claim 11, wherein the voltage is sampled from a capacitor of the loop filter and stored onto a first capacitor of the loop sampler circuit, when the reference signal is present; and
wherein the voltage is supplied to the loop filter, when the clock detect signal indicates that the reference signal is lost.

13. The system of claim 11, wherein the voltage is sampled from an output of the loop filter and stored onto a second capacitor of the loop sampler circuit, when the reference signal is present; and
wherein the voltage is supplied to an input of a voltage-controlled oscillator (VCO) of the PLL, when the reference signal is lost.

14. The system of claim 13, wherein a second voltage is sampled from a capacitor of the loop filter and stored onto a first capacitor of the loop sampler circuit, when the reference signal is present; and
wherein the second voltage is supplied to the loop filter, when the clock detect signal indicates that the reference signal is lost.

15. The system of claim 11, wherein a pulse generator circuit of the loop sampler circuit is operable to receive the reference signal and sample the reference signal to generate pulses indicating a sampling period for the sampling of the voltage.

16. The system of claim 15, wherein the pulse generator circuit is operable to sample falling edges of the reference signal, and
wherein a phase-frequency detector of the PLL is operable to align phases of rising edges of the reference signal and a feedback signal of the PLL.

17. The system of claim 15, wherein a switch of the loop sampler circuit is operable to sample the voltage by successively opening and closing according to the pulses.

18. The system of claim 11, wherein the voltage is stored on a capacitor of the loop sampler circuit.

19. The system of claim 11, wherein the clock detect circuit is operable to continuously detect a reference signal; and a predetermined amount of time after the clock detect circuit no longer detects the reference signal, the clock detect circuit is operable to generate the clock detect signal indicating that the reference signal is lost.

20. The system of claim 11, wherein the PLL further comprises a charge pump arranged to receive the clock detect signal, wherein the charge pump is operable when the clock detect signal indicates the reference signal is present, and wherein the charge pump is disabled when the clock detect signal indicates the reference signal is lost.

* * * * *